United States Patent
Oka et al.

(10) Patent No.: US 10,276,827 B2
(45) Date of Patent: Apr. 30, 2019

(54) DEVICE STRUCTURE AND METHOD OF PRODUCING THE SAME

(71) Applicant: Ulvac, Inc., Kanagawa (JP)

(72) Inventors: Tadashi Oka, Kanagawa (JP); Yuko Kato, Kanagawa (JP); Takahiro Yajima, Kanagawa (JP); Yousuke Matsumoto, Kanagawa (JP); Shouta Kanai, Kanagawa (JP); Yasuaki Murata, Kanagawa (JP)

(73) Assignee: ULVAC, INC., Chigasaki-Shi, Kanagawa (JP)

( * ) Notice: Subject to any disclaimer, the term of this patent is extended or adjusted under 35 U.S.C. 154(b) by 37 days.

(21) Appl. No.: 14/896,572

(22) PCT Filed: May 21, 2014

(86) PCT No.: PCT/JP2014/002661
§ 371 (c)(1),
(2) Date: Dec. 7, 2015

(87) PCT Pub. No.: WO2014/196137
PCT Pub. Date: Dec. 11, 2014

(65) Prior Publication Data
US 2016/0126495 A1 May 5, 2016

(30) Foreign Application Priority Data
Jun. 7, 2013 (JP) .................................. 2013-120814

(51) Int. Cl.
*H01L 51/56* (2006.01)
*H01L 51/52* (2006.01)
*H01L 51/00* (2006.01)

(52) U.S. Cl.
CPC ........ *H01L 51/5253* (2013.01); *H01L 51/004* (2013.01); *H01L 51/5246* (2013.01); *H01L 51/56* (2013.01); *H01L 2251/301* (2013.01)

(58) Field of Classification Search
CPC ...................................................... B05D 3/067
See application file for complete search history.

(56) References Cited

U.S. PATENT DOCUMENTS

| | | | |
|---|---|---|---|
| 2006/0158108 A1* | 7/2006 | Hayashi | H01L 51/5253 313/506 |
| 2006/0158111 A1 | 7/2006 | Hayashi | |

(Continued)

FOREIGN PATENT DOCUMENTS

| | | |
|---|---|---|
| JP | 2004-079291 A | 3/2004 |
| JP | 2005-100685 A | 4/2005 |

(Continued)

OTHER PUBLICATIONS

Office Action dated Jul. 21, 2016 in Taiwanese Application No. 103118990.

(Continued)

*Primary Examiner* — Fernando L Toledo
*Assistant Examiner* — Valerie N Newton
(74) *Attorney, Agent, or Firm* — Saliwanchik, Lloyd & Eisenschenk

(57) ABSTRACT

To provide a device structure that is capable of preventing oxygen, water, and the like from entering the device, and a method of producing the same.

A device structure 10 according to an embodiment of the present invention includes a substrate (base) 2, a device layer 3, a first inorganic material layer (convex portion) 41, and a first resin material 51. The substrate 2 has a first surface 2a and a second surface 2c opposite to the first surface 2a. The device layer 3 is arranged on at least the first (Continued)

surface 2*a* out of the first and second surfaces 2*a* and 2*c*. The first inorganic material layer 41 is formed on the first surface 2*a*. The first resin material 51 is unevenly arranged around the first inorganic material layer 41.

9 Claims, 5 Drawing Sheets

(56) References Cited

U.S. PATENT DOCUMENTS

| | | |
|---|---|---|
| 2007/0222382 A1 | 9/2007 | Yamazaki et al. |
| 2013/0126939 A1 | 5/2013 | Ishikawa et al. |

FOREIGN PATENT DOCUMENTS

| | | |
|---|---|---|
| JP | 2006-222070 A | 8/2006 |
| JP | 2006-222071 A | 8/2006 |
| JP | 2007-287660 A | 11/2007 |
| JP | 2007-311219 A | 11/2007 |
| JP | 2013-016372 A | 1/2013 |
| JP | 2013-073880 A | 4/2013 |
| TW | 201216542 A | 4/2012 |

OTHER PUBLICATIONS

International Search Report in International Application No. PCT/JP2014-002661, filed May 21, 2014.

* cited by examiner

DEVICE STRUCTURE AND METHOD OF PRODUCING THE SAME

CROSS-REFERENCE TO RELATED APPLICATIONS

This application is the U.S. national stage application of International Patent Application No. PCT/JP2014/002661, filed May 21, 2014, which claims priority to Japanese Application No. 2013-120814, filed Jun. 7, 2013, the disclosures of each of which are incorporated herein by reference in their entirety.

TECHNICAL FIELD

The present invention relates to a device structure having a laminated structure that protects a device or the like from oxygen, water, and the like, and a method of producing the same.

BACKGROUND ART

As a device including a compound that is degraded by water, oxygen, or the like, an organic electro-luminescence (EL) device is known. For such a device, attempts are being made to prevent water or the like from entering the device by forming a laminated structure of a layer including the compound and a protective layer covering the layer. For example, in Patent Document 1, a light emitting element having a protect film that is provided on an upper electrode layer and includes a laminated film of an inorganic film and an organic film is described.

CITATION LIST

Patent Document

Patent Document 1: Japanese Patent Application Laid-open No. 2013-73880

DISCLOSURE OF THE INVENTION

Problem to be Solved by the Invention

However, the coverage of an inorganic film having barrier properties for water vapor or the like is relatively low, and if the surface of a substrate having a device layer has a concavo-convex portion, the concavo-convex portion cannot be sufficiently covered, which may cause poor covering at boundaries of the concavo-convex portion, for example. If poor covering of the inorganic film is caused, water intrusion from the portion cannot be prevented, which makes it difficult to ensure sufficient barrier properties.

In view of the circumstances as described above, it is an object of the present invention to provide a device structure that is capable of improving barrier properties for water vapor or the like, and a method of producing the same.

Means for Solving the Problem

In order to achieve the above-mentioned object, a device structure according to an embodiment of the present invention includes a substrate, a device layer, a convex portion, and a first resin material.

The substrate has a first surface and a second surface opposite to the first surface.

The device layer is arranged on at least the first surface out of the first and second surfaces.

The convex portion is formed on the first surface.

The first resin material is unevenly arranged around the convex portion.

A method of producing a device structure according to an embodiment of the present invention includes forming a convex portion made of a first inorganic material layer covering a device layer provided on a surface of a substrate.

An organic material in the form of liquid is supplied to the surface of the substrate and the organic material is flocculated on boundaries between a side surface of the convex portion and the surface of the substrate.

A second inorganic material layer covering the convex portion and the organic material is formed on the surface of the substrate.

MODE(S) FOR CARRYING OUT THE INVENTION

Figure 1:
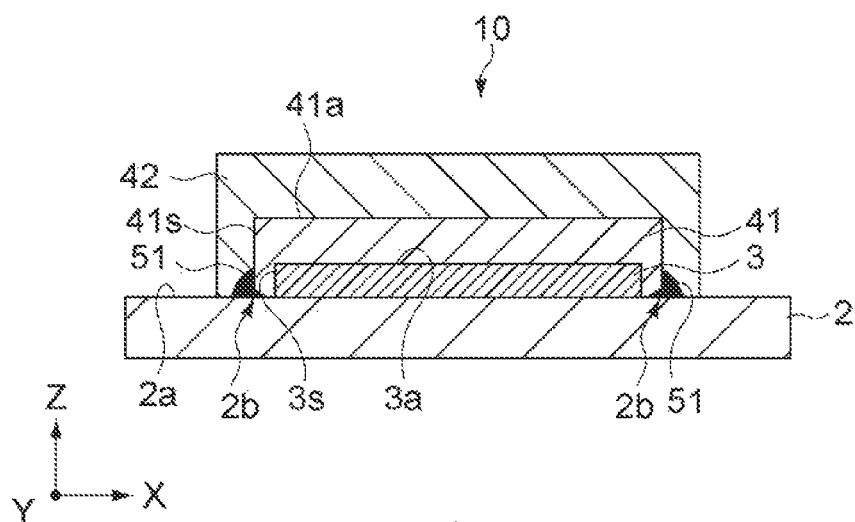
FIG. 1 is a schematic cross-sectional view showing a device structure according a first embodiment of the present invention.

A device structure according to an embodiment of the present invention includes a substrate, a device layer, a convex portion, and a first resin material.

The substrate has a first surface and a second surface opposite to the first surface.

The device layer is arranged on at least the first surface out of the first and second surfaces.

The convex portion is formed on the first surface.

The first resin material is unevenly arranged around the convex portion.

In the device structure, it is possible to prevent intrusion of water or the like from the surroundings of the convex portion because the first resin material is unevenly arranged around the convex portion formed on the surface (first surface) of the substrate on which the device layer is arranged. Moreover, because the first resin material is unevenly arranged around the convex portion, even if poor covering on the side surface of the device layer is caused due to the convex portion, it is possible to cover the poor covering portion with the first resin material.

The material or form of the substrate is not particularly limited. The substrate may be made of glass, a semiconductor, or the like, or may be a film including plastic, metal, or the like. The convex portion may include a device layer, or may be formed to cover a device layer. The configuration in which the convex portion includes a device layer includes a laminated body in which the convex portion includes a device layer, a structure in which a part of a device layer is exposed to the surface of the convex portion, and the like. The convex portion may be formed to cover the side surface of the device layer, or a plurality of convex portions may be formed on the device layer.

The convex portion may be made of a first inorganic material layer covering the device layer. The device structure may further include a second inorganic material layer covering the first resin material and the first inorganic material layer.

The first inorganic material layer is provided on the surface (first surface) of the substrate so as to cover the surface and the side surface of the device layer. The first inorganic material layer typically includes an inorganic material having barrier properties for water vapor, such as silicon nitride, silicon oxide, silicon oxynitride, and aluminum oxide. The first inorganic material layer is typically deposited by a sputtering method, an ALD method, a CVD method, or the like. However, because the coverage thereof is relatively low, there are cases where the boundaries between the side surface of the device layer and the surface of the substrate cannot be properly covered, for example. However, in this embodiment, because the first resin material is unevenly arranged around the convex portion, i.e., on the boundaries between the side surface of the device layer and the surface of the substrate, it is possible to properly cover the boundaries with the first resin material.

The second inorganic material layer typically includes an inorganic material having barrier properties for water vapor, such as silicon nitride, silicon oxide, silicon oxynitride, and aluminum oxide. The second inorganic material layer is typically deposited by a sputtering method, an ALD method, a CVD method, or the like. In this case, because the second inorganic material layer is deposited on the first resin material that has been unevenly arranged on the boundaries, the coverage of the second inorganic material for the convex portion is improved. Accordingly, it is possible to produce the device structure capable of preventing oxygen, water, and the like from entering the device.

The method of forming the first resin material is not particularly limited. Typically, an organic material in the form of liquid, gas, or mist is coated on the surface of the substrate by an appropriate coating method such as a spraying method, a spin coating method, and a deposition method. The organic material right after the coating is unevenly arranged on the boundaries between the side surface of the convex portion and the surface of the substrate by entering minute space by capillary action, or being formed into a droplet or flocculated by its own surface tension. After that, it is possible to form the first resin material around the convex portion, i.e., on the boundaries by curing the organic material.

The organic material forming the first resin material is not particularly limited. Typically, a material that is capable of being formed into a droplet on the substrate by its own surface tension, being flocculated, and moving on the substrate to be unevenly arranged around the convex portion is used for the organic material. For example, as the organic material, acrylic resin, polyurea resin, or the like, is used. Moreover, by using an organic material that is cured by irradiation of an energy line such as ultraviolet rays, it is possible to easily cure the resin. Also the conditions for coating the organic material are not particularly limited. However, it is favorable to limit the coating amount not to prevent the organic material from being formed into a droplet, or not to form a film of the inorganic material. Moreover, as necessary, it may be possible to, for example, tilt the substrate or vibrate the substrate to facilitate the movement of the organic material to the vicinity of the convex portion.

The device structure may further include a second resin material. The second resin material is interposed between the first inorganic material layer and the second inorganic material layer and is unevenly arranged on a surface of the convex portion apart from the first resin material.

The surface of the first inorganic material layer is not necessarily flat. For example, a particle or the like is mixed in the film during deposition, resulting in a formed concavo-convex portion. If a particle or the like is mixed in the first inorganic material layer, the coverage of the first inorganic material layer for the device layer is reduced, and thus, desired barrier properties cannot be obtained.

As a countermeasure, the above-mentioned device structure has a structure in which a second resin material is filed in the poor covering portion of the first inorganic material layer, which is formed by mixing of a particle, for example. Typically, the first resin material is unevenly arranged on the boundaries between the surface of the first inorganic material layer and the peripheral surface of the particle. Accordingly, the coverage for the device layer is improved, and it is possible to properly deposit the second inorganic material layer because the second resin material functions as a base.

The second resin material is formed by the same method as that for the first resin material. The second resin material may include the same inorganic material as that of the first resin material. In this case, it is possible to simultaneously form the first resin material and the second resin material in the same process. In this case, the organic material that is unevenly arranged on the boundaries between the side surface of the convex portion and the surface of the substrate forms the first resin material, and the organic material that is unevenly arranged on the surface of the convex portion forms the second resin material.

A method of producing a device structure according to an embodiment of the present disclosure includes forming a convex portion made of a first inorganic material layer covering a device layer provided on a surface of a substrate.

An organic material in the form of liquid is supplied to the surface of the substrate and the organic material is flocculated on boundaries between a side surface of the convex portion and the surface of the substrate.

A second inorganic material layer covering the convex portion and the organic material is formed on the surface of the substrate.

In the above-mentioned production method, the organic material coated on the surface of the substrate is unevenly arranged on the boundaries between the side surface of the convex portion and the surface of the substrate by entering minute space by capillary action to be formed into a droplet or flocculated by its own surface tension. After that, it is possible to form an aggregate of the organic material (resin material) on the boundaries by curing the organic material. Therefore, because the second inorganic material layer is deposited on the resin material that is unevenly arranged on the boundaries, the coverage of the second inorganic material for the convex portion is improved. Accordingly, it is possible to produce a device structure capable of preventing oxygen, water, and the like from entering the device.

Hereinafter, embodiments of the present invention will be described with reference to drawings.

First Embodiment

Figure 2:
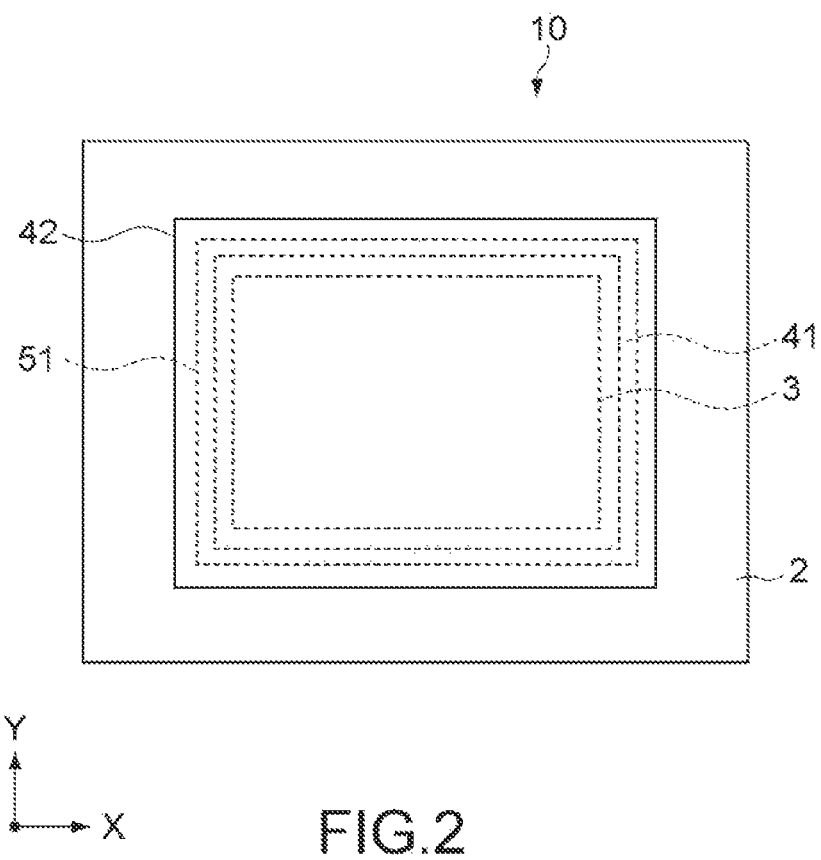
FIG. 2 is a plan view of the device structure.

FIG. 1 is a schematic cross-sectional view showing a device structure according an embodiment of the present invention, and FIG. 2 is a plan view of the above-mentioned device structure. In each figure, an X-axis direction, a Y-axis direction, and a Z-axis direction represent triaxial directions orthogonal to each other. In this embodiment, the X-axis direction and the Y-axis direction are horizontal directions orthogonal to each other, and the Z-axis direction is the vertical direction.

A device structure 10 according to this embodiment includes a substrate (base) 2 including a device layer 3, a first inorganic material layer (convex portion) 41 formed on a surface 2a of the substrate 2, a second inorganic material layer 42 covering the first inorganic material layer 41. In this embodiment, the device structure 10 is made of a light emitting element having an organic EL luminescent layer.

The substrate 2 has the surface (first surface) 2a and a rear surface (second surface) 2c, and is made of a glass substrate, a plastic substrate, or the like. The shape of the substrate 2 is not particularly limited. In this embodiment, the substrate 2 is formed to have a rectangular shape. The size, thickness, and the like of the substrate 2 are not particularly limited. Depending on the size of the device, those having an appropriate size, thickness, and the like are used as the substrate 2. In this embodiment, a plurality of device structure 10 are prepared from aggregates of the same devices prepared on a large substrate.

The device layer 3 is made of an organic EL luminescent layer including an upper electrode and a lower electrode. Other than that, the device layer 3 may be made of various functional elements including materials that are easy to degrade by water, oxygen, or the like, such as a liquid crystal layer in a liquid crystal element and an electricity generation layer in an electricity generation device.

The device layer 3 is deposited on a predetermined area of the surface 2a of the substrate 2. The plane shape of the device layer 3 is not particularly limited. In this embodiment, the device layer 3 is formed to have a rectangular shape. However, other than that, the device layer 3 may be formed to have a circular shape, linear shape, or the like. The device layer 3 is not necessarily arranged on the surface 2a of the substrate 2, and only has to be arranged on at least one of the surface 2a and the rear surface 2c of the substrate 2.

The first inorganic material layer 41 is provided on the surface (surface 2a in this embodiment) of the substrate 2 on which the device layer 3 is arranged, and forms a convex portion covering a surface 3a and a side surface 3s of the device layer 3. The first inorganic material layer 41 has a solid structure that is projected from the surface 2a of the substrate 2 to the upper side of the figure.

The first inorganic material layer 41 includes an inorganic material capable of protecting the device layer 3 from water, oxygen, and the like. In this embodiment, the first inorganic material layer 41 includes silicon nitride (SiNx), which has excellent barrier properties for water vapor. However, it is not limited thereto, and the first inorganic material layer 41 may include another silicon compound such as silicon oxide and silicon oxynitride or another inorganic material having barrier properties for water vapor such as aluminum oxide.

The first inorganic material layer 41 is deposited on the surface 2a of the substrate 2 using an appropriate mask, for example. In this embodiment, the first inorganic material layer 41 is deposited using a mask having a rectangular opening with a size that can accommodate the device layer 3. The deposition method is not particularly limited. For example, a CVD (Chemical Vapor Deposition) method, a sputtering method, an ALD (Atomic Layer Deposition) method, or the like can be applied thereto. The thickness of the first inorganic material layer 41 is not particularly limited, and is 200 nm to 2 μm, for example.

The second inorganic material layer 42 includes an inorganic material that is capable of protecting the device layer 3 from water, oxygen, and the like, as in the first inorganic material layer 41, and is provided on the surface 2a of the substrate 2 so as to cover a surface 41a and a side surface 41s of the first inorganic material layer 41. In this embodiment, the second inorganic material layer 42 includes silicon nitride (SiNx) having excellent barrier properties for water vapor. However, it is not limited thereto, and the second inorganic material layer 42 may include another silicon compound such as silicon oxide and silicon oxynitride or another inorganic material having barrier properties for water vapor such as aluminum oxide.

The second inorganic material layer 42 is deposited on the surface 2a of the substrate 2 using an appropriate mask, for example. In this embodiment, the second inorganic material layer 42 is deposited using a mask having a rectangular opening with a size that can accommodate the first inorganic material layer 41. The deposition method is not particularly limited. For example, a CVD (Chemical Vapor Deposition) method, a sputtering method, an ALD (Atomic Layer Deposition) method, or the like can be applied thereto. The thickness of the second inorganic material layer 42 is not particularly limited, and is 300 nm to 1 μm, for example.

The device structure 10 according to this embodiment further includes a first resin material 51. The first resin material 51 is unevenly arranged around the first inorganic material layer (convex portion) 41. In this embodiment, the first resin material 51 is interposed between the first inorganic material layer 41 and the second inorganic material layer 42, and is unevenly arranged on boundaries 2b between the side surface 41s of the first inorganic material layer 41 and the surface 2a of the substrate 2. The first resin material 51 has a function of filling a gap G (FIG. 3) between the first inorganic material layer 41 and the surface 2a, which is formed around the boundaries 2b.

Figure 3:
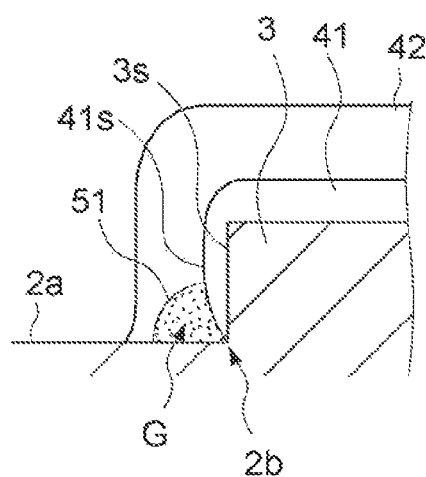
FIG. 3 is a main portion enlarged cross-sectional view of the device structure.

FIG. 3 is a main portion enlarged cross-sectional view of the device structure 10 showing the surrounding structure of the boundaries 2b. Because the first inorganic material layer 41 is formed by a CVD film or sputtering film including an inorganic material, the coverage for the concavo-convex structure surface of the substrate 2 including the device layer 3 is relatively low. As a result, as shown in FIG. 3, the coverage of the first inorganic material layer 41 that covers the side surface 3s of the device layer 3 is reduced around the surface 2a, and the thickness of the covering film may be extremely low or the covering film does not exist.

In view of the above, in this embodiment, by making the first resin material 51 be unevenly arranged on the above-mentioned poor covering area around the first inorganic material layer 41, it is possible to prevent water or oxygen from entering the device layer 3 from the poor covering area. Moreover, when the second inorganic material layer 42 is deposited, the first resin material 51 functions as an underlying layer of the second inorganic material layer 42, which makes it possible to properly deposit the second inorganic material layer 42 and to properly cover the side surface 41s of the first inorganic material layer 41 with a desired film thickness.

Figure 4:
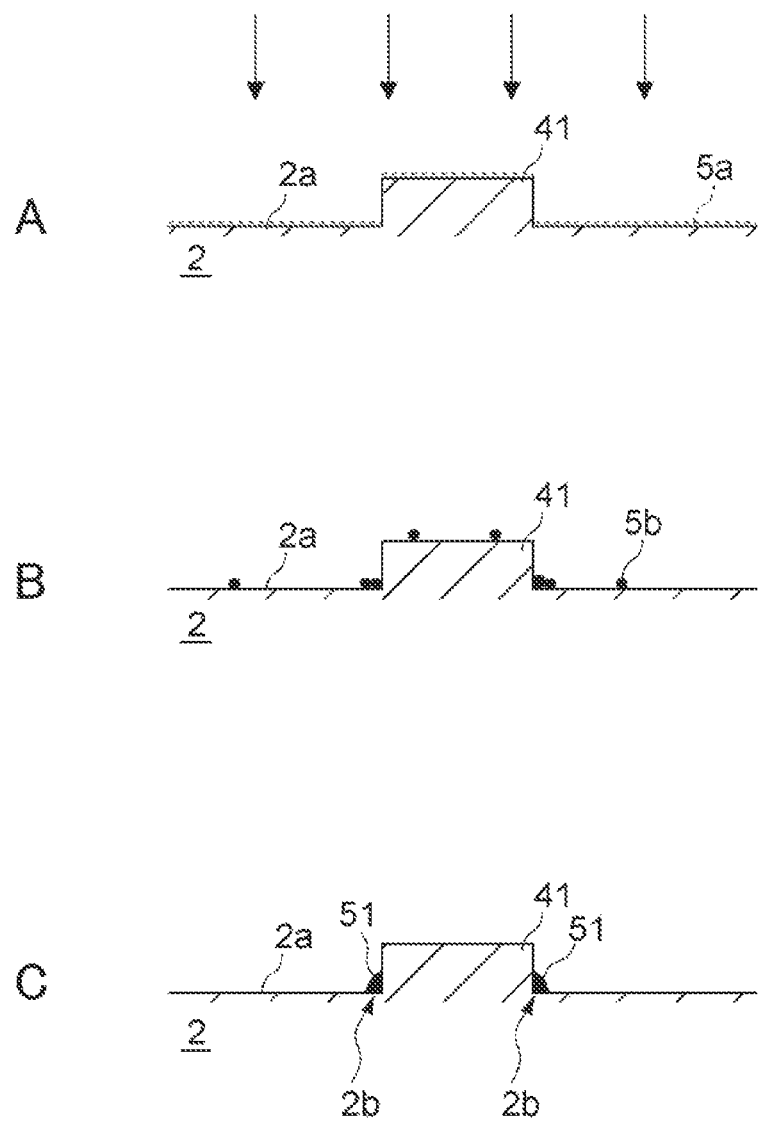
FIG. 4 is a process drawing for explaining a method of forming a first resin material in the device structure.

The method of forming the first resin material 51 is not particularly limited. Typically, an organic material in the form of liquid, gas, or mist is coated on the surface 2a by an appropriate coating method such as a spraying method, a spin coating method, and a deposition method. FIG. 4A to C schematically show a method of forming the first resin material 51.

First, as shown in FIG. 4A, an organic material 5a in the form of mist, which is heated and vaporized, for example, is supplied to the surface 2a of the substrate 2. At this time, the temperature of the substrate 2 is maintained to not more than the room temperature, for example. Accordingly, the organic material 5a in the form of mist is condensed on the surface 2a into an organic material 5b in the form of droplet, as shown in FIG. 4B. It should be noted that it is favorable to limit the supply amount of the organic material 5a not to prevent the organic material from being formed into a droplet.

The organic material 5b in the form of droplet enters minute space by capillary action or moves on the substrate 2 while being formed into a droplet or being flocculated by its own surface tension, and is unevenly arranged on the boundaries 2b between the side surface 41s of the first inorganic material layer 41 and the surface 2a of the substrate 2, as shown in FIG. 4C. After that, the first resin material 51 is formed on the boundaries 2b by curing the organic material.

The first resin material 51 may be continuously provided around the first inorganic material layer 41 along the boundaries 2b, or intermittently provided around the first inorganic material layer 41. By continuously providing the first resin material 51 along the boundaries 2b, it is possible to improve the coverage for the device layer 3.

According to this embodiment, because the first resin material 51 is formed from the organic material 5b in the form of droplet, a resin material easily permeates through the narrow gap G (FIG. 3) having an angle between the side surface 41s of the first inorganic material layer 41 and the surface 2a of the substrate 2 on the boundaries 2b, which is less than 90°. Accordingly, the gap G of the boundaries 2b is filled with the first resin material 51, and it is possible to achieve high barrier properties for water vapor for the device layer 3.

The organic material forming the first resin material 51 is not particularly limited. Typically, a material that is capable of being formed into a droplet on the substrate 2 by its own surface tension, being flocculated, and moving on the substrate to be unevenly arranged around the first inorganic material layer 41 is used as the organic material. In this embodiment, as the organic material, acrylic resin, more specifically, acrylic ultraviolet curable resin is used. Accordingly, it is possible to easily cure the organic material unevenly arranged on the boundaries 2b.

After the first resin material 51 is formed, the second inorganic material layer 42 that covers the surface 41a and the side surface 41s of the first inorganic material layer 41 is deposited on the surface 2a of the substrate 2. The second inorganic material layer 42 is laminated on the surface 41a of the first inorganic material layer 41 around the surface 41a, and on the first resin material 51 and the side surface 41s of the first inorganic material layer 41 around the boundaries 2b. According to this embodiment, the first inorganic material layer 41 includes the same material as that of the second inorganic material layer 42, and comes into contact with the second inorganic material layer 42, resulting in improved adhesiveness between the first inorganic material layer 41 and the second inorganic material layer 42.

Figure 5:
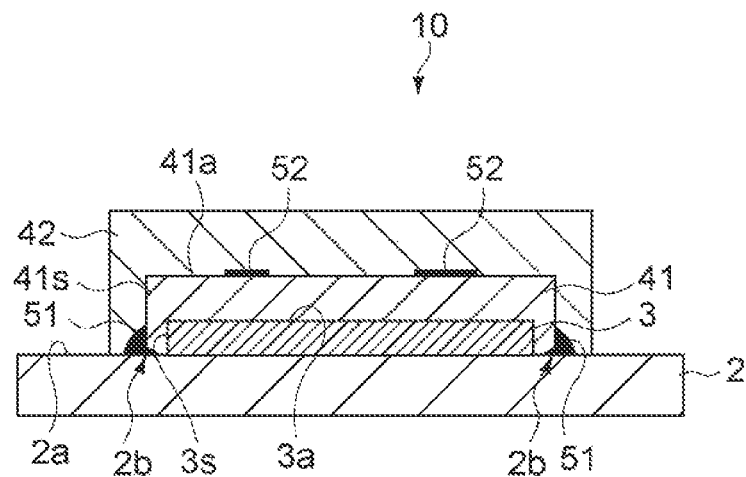
FIG. 5 is a schematic cross-sectional view showing a modified example of the configuration of the device structure.

The cured organic material (resin material) is not limited to the one unevenly arranged on the boundaries 2b. For example, the organic material may remain on the surface 2a, the surface 41a of the first inorganic material layer 41, or the like, other than the boundaries 2b. In this case, the second inorganic material layer 42 has an area that is laminated on the first inorganic material layer 41 via a second resin material 52, as shown in FIG. 5. The second resin material 52 is interposed between the first inorganic material layer 41 and the second inorganic material layer 42, and is unevenly arranged on the surface 41a of the first inorganic material layer 41 apart from the first resin material 51. Also in this case, the adhesiveness between the first inorganic material layer 41 and the second inorganic material layer 42 is maintained. Therefore, the barrier properties of the device structure 10 are not reduced.

As described above, according to the device structure 10 in this embodiment, because the side surface of the device layer 3 is covered by the first inorganic material layer 41 and the second inorganic material layer 42, it is possible to prevent water or oxygen from entering the device layer 3.

Moreover, according to this embodiment, because the first resin material 51 is unevenly arranged on the boundaries 2b, it is possible to prevent the barrier properties from being reduced due to the poor coverage of the first inorganic material layer 41 or the second inorganic material layer 42, and to maintain the stable device properties for a long time.

Second Embodiment

Figure 6:
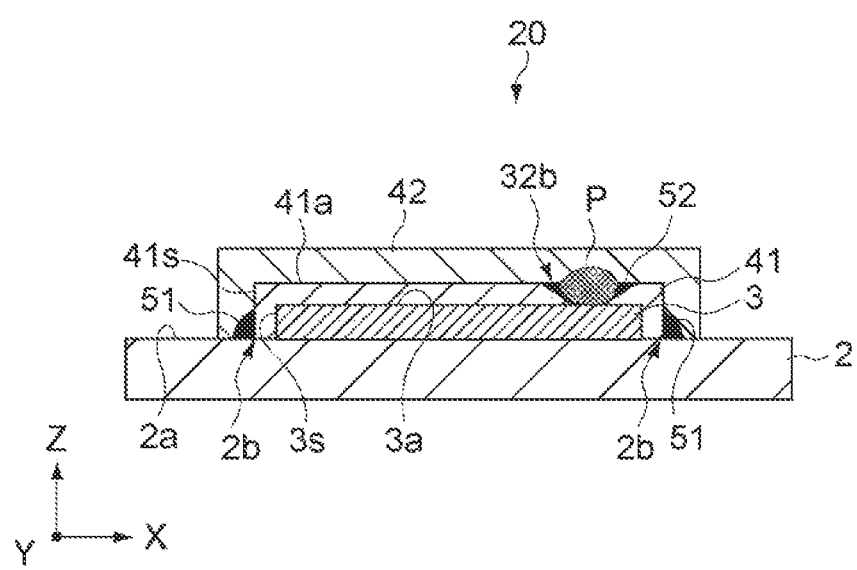
FIG. 6 is a schematic cross-sectional view showing a device structure according to a second embodiment of the present invention.

FIG. 6 is a cross-sectional view schematically showing the configuration of a device structure according to a second embodiment of the present invention. Hereinafter, the configurations different from those according to the first embodiment will be mainly described. The same configurations as those according to the above-mentioned embodiment will be denoted by the same reference numerals and a description thereof will be omitted or simplified.

A device structure 20 according to this embodiment further includes the second resin material 52 interposed between the first inorganic material layer 41 and the second inorganic material layer 42. The second resin material 52 is unevenly arranged on the surface of the first inorganic material layer 41 apart from the first resin material 51.

The surface of the first inorganic material layer 41 is not necessarily flat. For example, as shown in FIG. 6, a particle P may be mixed in the film prior to deposition (at the time of substrate transportation or before being placed in the deposition apparatus) or during deposition to form a concavo-convex portion on the surface of the first inorganic material layer 41. If a particle is mixed in the first inorganic material layer 41, the coverage of the first inorganic material layer 41 for the device layer 3 is reduced and thus there is a risk that desired barrier properties cannot be obtained.

In view of the above, the device structure 20 according to this embodiment has a structure in which the second resin material 52 is filled in the poor covering portion of the first inorganic material layer 41, which is caused due to the mixing of the particle P, for example. Typically, the second resin material 52 is unevenly arranged on boundaries 32b between the surface of the first inorganic material layer 41 and the peripheral surface of the particle P. Accordingly, the coverage of the device layer 3 is improved and the second resin material 52 functions as a base, which makes it possible to properly deposit the second inorganic material layer 42.

The second resin material 52 is formed by the same method as that of the first resin material 51. The second resin material 52 may include the same organic material as that of the first resin material 51. In this case, it is possible to simultaneously form the first resin material 51 and the second resin material 52 in the same process. At this time, the organic material in the form of droplet is flocculated on the boundaries 2b to form the first resin material 51. Similarly, the organic material in the form of droplet is flocculated on the boundaries 32b to form the second resin material 52.

According to this embodiment, the same operation and effect as those of the first embodiment can be obtained. Moreover, according to this embodiment, because the second resin material 52 can supplement the reduction of the film quality due to the mixing of the particle P, it is possible to improve the productivity while ensuring the desired barrier properties.

Third Embodiment

Figure 7:
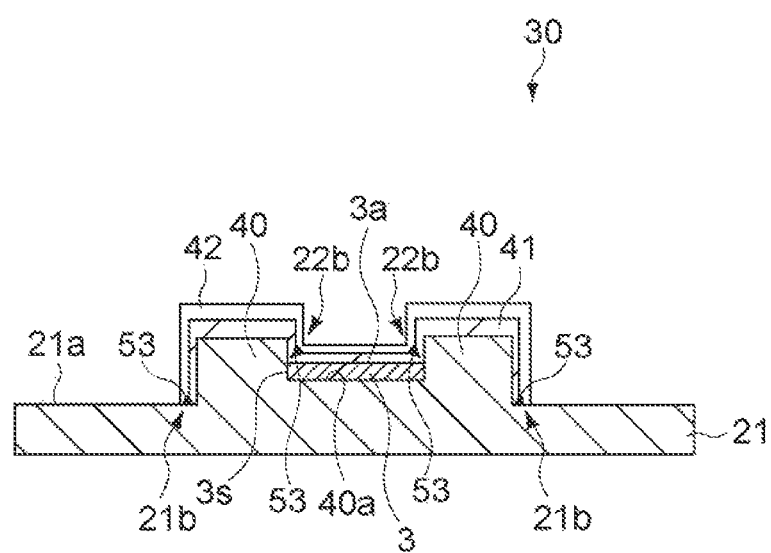
FIG. 7 is a schematic cross-sectional view showing a modified example of the configuration of the device structure according to the first embodiment.

FIG. 7 is a schematic cross-sectional view showing a device structure according to a third embodiment. Hereinafter, the configurations different from those according to the first embodiment will be mainly described. The same configurations as those according to the above-mentioned embodiments will be denoted by the same reference numerals and a description thereof will be omitted or simplified.

A device structure 30 according to this embodiment includes a substrate 21 including the device layer 3, a convex portion 40 that covers the side surface 3s of the device layer 3, the first inorganic material layer 41 formed on the surface of the substrate 21 so as to cover the convex portion 40 and the device layer 3, and the second inorganic material layer 42.

The convex portion 40 is formed on a surface 21a of the substrate 21, and has a concave portion 40a that accommodates the device layer 3 at the center. In this embodiment, the bottom surface of the concave portion 40a is formed at a position having a height higher than that of the surface 21a of the substrate 21. However, the bottom surface of the concave portion 40a may be formed at a position having the same height as that of the surface 21a or a position having a height lower than that of the surface 21a.

The device structure 30 further includes a resin material (first resin material) 53 interposed between the first inorganic material layer 41 and the second inorganic material layer 42. The resin material 53 is unevenly arranged on boundaries 21b between the lateral surface of the convex portion 40 and the surface 21a of the substrate 21, and on boundaries 22b between the internal surface of the convex portion 40 and the device layer 3. Accordingly, it is possible to reduce the poor covering of the first and second inorganic material layers 41 and 42 for the convex portion 40 and the surface 3a of the device layer 3, and to improve the barrier properties. The resin material 53 is formed by the same method as that of the second resin materials 51 and 52, and the surface tension of an organic material in the form of droplet can be used to make the resin material 53 be unevenly arranged on the above-mentioned positions.

Hereinabove, embodiments of the present invention have been described. However, the embodiments of the present disclosure are not limited to the above-mentioned embodiments and it goes without saying that various modifications can be made without departing from the gist of the present invention.

For example, in the above-mentioned embodiments, the second inorganic material layer 42 covering the first inorganic material layer 41 is formed to have a single layer. However, the second inorganic material layer 42 may have multiple layers. In this case, a resin material to be unevenly arranged on the concavo-convex portion of the substrate may be formed by supplying an organic material to the substrate for the deposition of each layer. Accordingly, it is possible to further improve the barrier properties.

Furthermore, in the above-mentioned embodiments, the first resin material 51 is unevenly arranged around the inorganic material layer 41 after the first inorganic material layer 41 is formed. However, before the first inorganic material layer 41 is formed, the first resin material 51 may be unevenly arranged around the device layer 3. Accordingly, it is possible to improve the covering efficiency of the device layer 3 by the first inorganic material layer 41.

DESCRIPTION OF REFERENCE NUMERALS

2, 21 substrate
2b, 21b, 22b, 32b boundaries
3 device layer
10, 20, 30 device structure
40 convex portion
41 first inorganic material layer
42 second inorganic material layer
51, 53 first resin material
52 second resin material

The invention claimed is:

1. A device structure, comprising:
   a substrate having a first surface and a second surface opposite to the first surface;
   a device layer arranged on the first surface of the substrate;
   a first convex portion formed on the first surface, the first convex portion being made of a first inorganic material layer covering the device layer;
   a first resin material selectively arranged around the first convex portion to fill a gap between the first convex portion and the first surface; and
   a second convex portion made of a second inorganic material layer fully covering the first resin material and an upper surface and a side surface of the first inorganic material layer,
   wherein the second inorganic material layer is in direct contact with the substrate, the first resin material, and the first inorganic material layer.

2. The device structure according to claim 1, further comprising:
   a second resin material that is interposed between the first inorganic material layer and the second inorganic material layer and is unevenly arranged on a surface of the first convex portion apart from the first resin material.

3. The device structure according to claim 1, further comprising:
   a second resin material filled in boundaries between a surface of the first convex portion and a particle attached to the surface of the first convex portion.

4. The device structure according to claim 1, wherein the first resin material is continuously provided along boundaries between a side surface of the first convex portion and the first surface.

5. The device structure according to claim 4, wherein an angle between the side surface of the first convex portion and the first surface on the boundaries is less than 90°; and
   the boundaries are filled with the first resin material.

6. The device structure according to claim 1, wherein the first inorganic material layer includes a silicon compound.

7. The device structure according to claim 1, wherein the first resin material includes any one of acrylic resin and polyurea resin.

8. The device structure according to claim 1, wherein the device layer includes an organic luminescent layer.

9. A method of producing a device structure, comprising:
forming a convex portion made of first inorganic material layer covering a device layer provided on a surface of a substrate;
forming a resin layer selectively arranged around the convex portion to fill a gap between the convex portion and the surface of the substrate by supplying an organic material in the form of liquid to the surface of the substrate and selectively flocculating the organic material on boundaries between a side surface of the convex portion and the surface of the substrate; and
forming a second inorganic material layer fully covering the side surface of the convex portion and the material, so that the second inorganic material layer is in direct contact with the substrate, the resin material, and the first inorganic material layer, by deposition of an inorganic material on the surface of the substrate.

* * * * *